United States Patent
Jaber et al.

(10) Patent No.: US 7,734,972 B2
(45) Date of Patent: Jun. 8, 2010

(54) COMMON TEST LOGIC FOR MULTIPLE OPERATION MODES

(75) Inventors: Talal Jaber, Austin, TX (US); David M. Wu, Pflugerville, TX (US); Ming Zhang, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 318 days.

(21) Appl. No.: 12/010,000

(22) Filed: Jan. 23, 2008

(65) Prior Publication Data

US 2009/0187799 A1 Jul. 23, 2009

(51) Int. Cl.
*G01R 31/28* (2006.01)

(52) U.S. Cl. .................. 714/727; 714/729; 714/733

(58) Field of Classification Search ............ 438/11; 712/200; 718/100; 714/724, 726, 727, 729, 714/733

See application file for complete search history.

(56) References Cited

U.S. PATENT DOCUMENTS

| | | | |
|---|---|---|---|
| 6,009,488 A | 12/1999 | Kavipurapu | 710/105 |
| 7,028,239 B2 | 4/2006 | Jaber | 714/733 |
| 7,256,055 B2 * | 8/2007 | Aghababazadeh et al. | 438/11 |
| 7,353,440 B2 * | 4/2008 | Ohwada et al. | 714/726 |
| 7,647,476 B2 * | 1/2010 | Mozak et al. | 712/200 |
| 2008/0134180 A1 * | 6/2008 | Floyd | 718/100 |
| 2008/0276144 A1 * | 11/2008 | Huben et al. | 714/733 |

* cited by examiner

*Primary Examiner*—David Ton
(74) *Attorney, Agent, or Firm*—Trop, Pruner & Hu, P.C.

(57) ABSTRACT

In one embodiment, the present invention includes a processor having a plurality of logical units to perform operations on data. Each unit may include a multiple input shift register (MISR) at an input of the logical unit to collect and compress data from input signals to the unit. In turn, each MISR may includes bit cells, each having a first cell to receive incoming data and controlled by a first clock signal, a second cell to receive an output of the first cell and controlled by a second clock signal, a mask cell to receive an output of the second cell and to generate a mask signal responsive to a mask clock signal, and a multiplexer coupled between the first and second cells. Other embodiments are described and claimed.

15 Claims, 7 Drawing Sheets

DETAILED DESCRIPTION# COMMON TEST LOGIC FOR MULTIPLE OPERATION MODES

BACKGROUND

Given the ever-increasing complexity of semiconductor devices, many integrated circuits (ICs) are designed with various test circuitry present. Typically, such test circuitry is specialized to perform a particular test on a given functional unit or block of the semiconductor device. For example, such test circuits can include design for test (DFT) circuits and other circuitry used for debug or test features. Still further, some circuits include additional error detection and/or correction circuitry such as may be used during operation modes in the field when high levels of reliability-availability-serviceability (RAS) are needed.

However, additional circuits increase complexity consume chip area and power consumption. Furthermore, significant design efforts are needed to develop specialized circuitry for such diverse needs.

DETAILED DESCRIPTION

Figure 1:
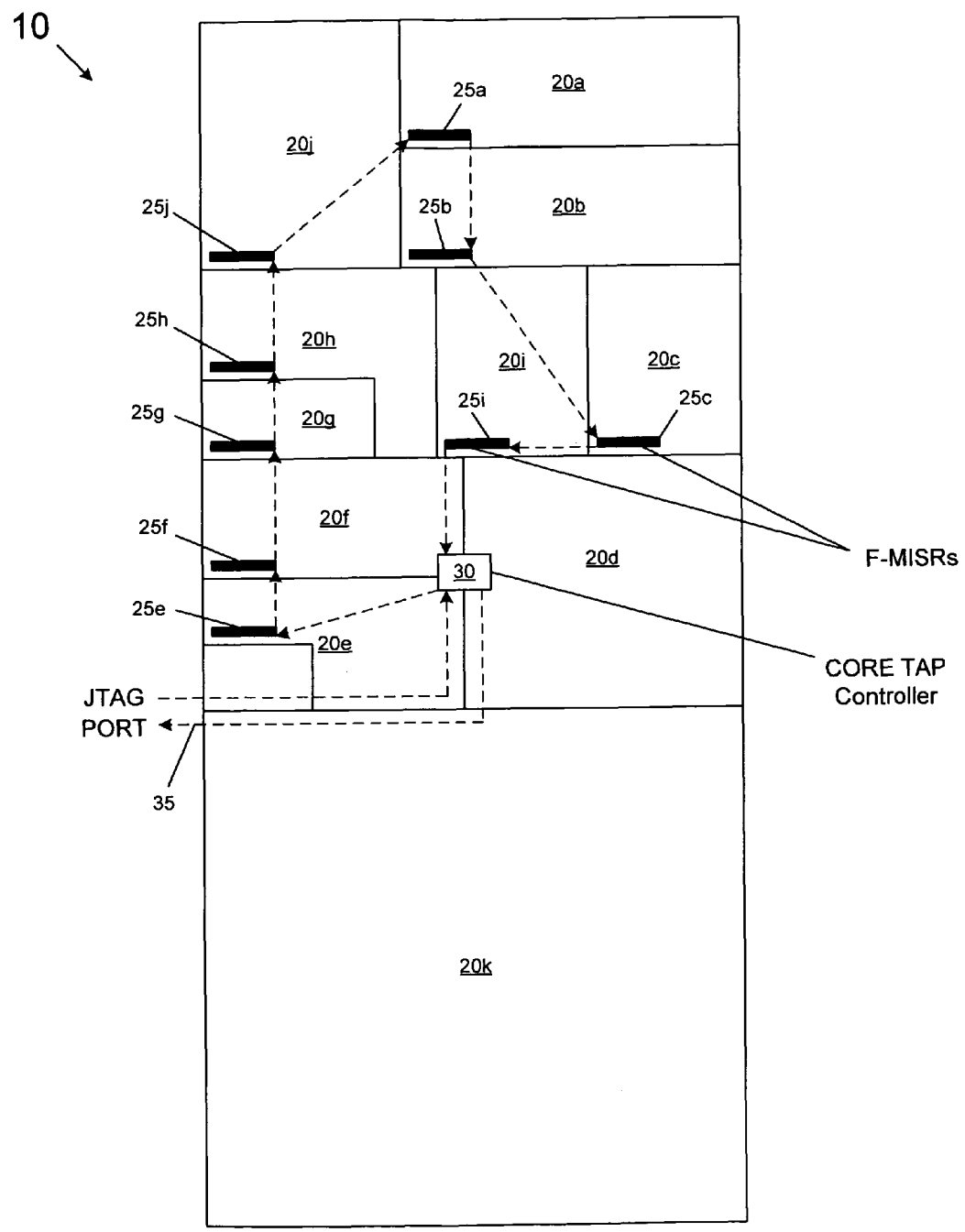
FIG. 1 is a block diagram of a semiconductor device in accordance with one embodiment of the present invention.

Embodiments may provide an apparatus and a structure to enable design for test (DFT), reliability-availability-serviceability (RAS), debug and test features all to be supported through a common logic structure embedded in a processor core. That is, generic, common test circuitry in accordance with an embodiment of the present invention can be used to handle test operations occurring during design, debug, manufacturing testing, as well as during normal operation of the semiconductor device in the field. As examples, DFT operations may be used to test the device on prototype production. Functional test features may be tested by the same common circuitry during manufacture, for example, to speed bin different devices according to highest operating frequency. Still further, the same common circuitry can be used during RAS operations during normal operation of the device, such as for detection of soft errors, intermittent errors or errors due to voltage or power droops, or the like. Thus, using a generic common structure, the extent and effort to design specialized test logic for these disparate operations can be avoided. Still further, the layout complexity of inserting such multiple disparate testing circuitry is also avoided, as embodiments may provide for a common, generic location for this common circuitry, namely at an input of a given functional unit.

In one embodiment this common structure includes a logical block having a functional multiple input shift register (F-MISR) for data compression and associated control signals. This logical block, referred to herein as a F-MISR block, may be provided in every logic unit present in the processor RTL hierarchy to interface with this circuitry; an IEEE 1149.1-based test access port (TAP) controller capable of receiving Joint Test Action Group (JTAG) commands through the JTAG port and further capable of monitoring and recognizing breakpoint events taken by the processor may be provided, along with a global connectivity of the various F-MISR blocks to configure the F-MISR blocks in all units into one single scan chain (or a test data register (TDR)), accessible by means and through the TAP controller and a unit test controller (UTC) in each logical unit to provide the control signals and scan clocks to perform a scan dump of the scan chain housing the F-MISR blocks. By providing a single generic common DFT, RAS, test (e.g., for structured based functional tests (SBFT), speed binning and so forth) and debug structure, potentially substantial return-on-investment (ROI) for the cost of implementing this structure can be realized.

Embodiments also allow for data compression within a definite time window. This time window is normally defined by the pre-programming of breakpoint events that the processor may take at the start and end of the time window during which data is compressed. Data compression on good machines will invariably lead to the same golden signature. Data compression on faulty machines will invariably lead to inconsistent and erroneous signatures. Embodiments may be used for debug where the entire set of F-MISRs can be read, through a scan dump operation and via the TAP JTAG bus, while the processor is still running or stopped. That is, because embodiments may run at a clock that is different than the operating frequency of the processor (in various embodiments, at one or more orders of magnitude lower than such speeds), such testing can be performed independently of processor operation. Embodiments may provide scan cells in the implementation of the F-MISRs that are optimum in area. Still further, the entire F-MISR scan chain is dormant when not in use and thus contributes no dynamic power in that mode. Also, no special library scan cells are required to implement the F-MISRs and the structure, and any functional sequential cell can be usable in this implementation. The F-MISR scan chain provides added observation points when plain functional tests, or SBFT are being invoked. This added observeability will lead to better fault grading coverage. A very robust speed binning can be realized because all functional paths between logic units are being sampled by the F-MISR blocks in each unit. The F-MISR golden signature will determine the maximum clock speed at which a given processor runs. Gross delay faults are detected as a side benefit for speed binning.

Referring now to FIG. 1, shown is a block diagram of a semiconductor device in accordance with one embodiment of the present invention. As shown in FIG. 1, device 10, which may be a given core of a multicore processor can include a plurality of logical units $20_a$-$20_k$ (generically logical unit 20). Furthermore, device 10 includes a core TAP controller 30. As shown in FIG. 1, each logical unit 20 includes a F-MISR $25_a$-$25_i$ (generically F-MISR 25).

More specifically, as shown in FIG. 1, each F-MISR is present at an input of the unit, collecting and compressing data from all primary input signals feeding into the unit. In various embodiments, such compression of data may be at system clock speed, although the scope of the present invention is not limited in this regard. F-MISR 25 may be accessible through a JTAG port 35 while device 10 is running.

Furthermore F-MISR 25 may be initialized through TAP controller 30, and may be enabled and disabled by means of breakpoints taken during normal mode execution. While shown with this particular implementation in the embodiment of FIG. 1, the scope of the present invention is not limited in this regard.

Figure 2A:
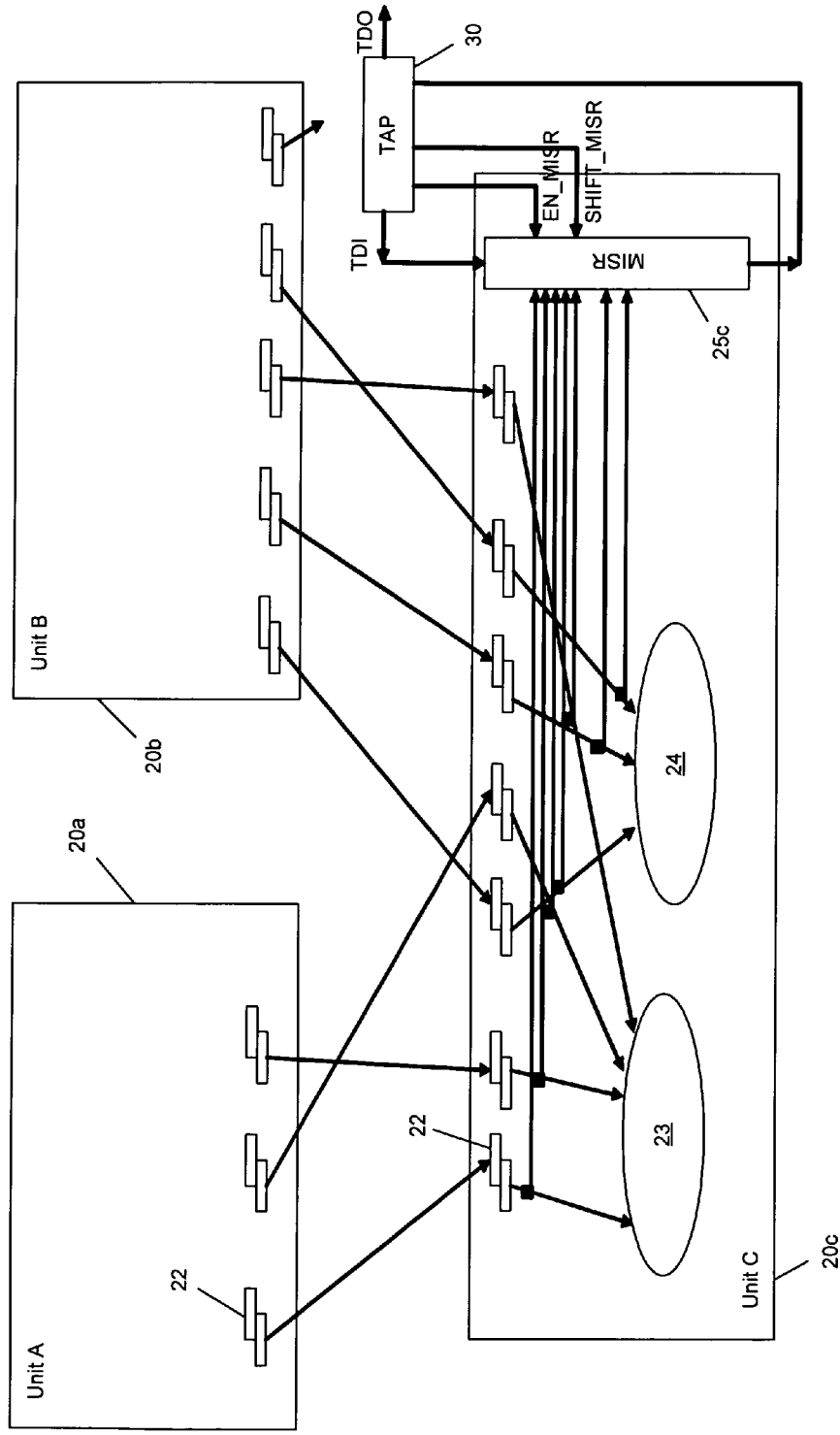
FIG. 2A is a block diagram of multiple logical units in accordance with one embodiment of the present invention.

Referring now to FIG. 2A, shown is a block diagram of multiple logical units $20_a$-$20_c$, including further details of a F-MISR placement and tap points within logical unit $20_c$. Specifically, each logical unit 20 includes multiple flops 22 that provide output signals from the unit and/or are present at an input of the units. Logical unit $20_c$ is further shown with various functional logic therein, namely logic 23 and 24. As shown in FIG. 2A, flops 22 receive incoming signals and provide them to these units. Furthermore, tap points along these interconnects are provided to enable the incoming signals to be delivered to F-MISR $25_c$. As shown in FIG. 2A, F-MISR 25 is further coupled to receive incoming initialization data, namely test data input (TDI) from TAP controller 30 as well as an enable signal (EN_MISR) and a shift control signal (SHIFT_MISR) from TAP controller 30. In turn, the data output from F-MISR $25_c$, is provided back to TAP controller 30. Note that while FIG. 2A shows MISR 25 only in logical unit $20_c$ in various implementations similar registers may be present in module units $20_a$ and $20_b$. Furthermore, a chain of such MISRs may be created by providing the output of MISR $25_c$ to such MISRs within logical units $20_a$ and $20_b$.

FIG. 2A thus describes a general implementation of a test/RAS structure in accordance with one embodiment of the present invention. The points to be tapped off and observed into F-MISR 25 are at the output of flops 22 that capture input signals coming from the other units. From a timing and speed binning perspective, any signal that did not make the timing between a flop in the source unit and a flop in the destination unit will result in a false data compression in F-MISR 25, and will cause an erroneous signature. Similarly, any soft or intermittent or hard error will result in an erroneous signature. The signature is by definition the final state of F-MISR 25 at the closing of the data compression window. The data compression window opening and closing is controlled essentially by TAP controller 30 through pre-programmed breakpoint events or through direct TAP controller 30 instructions.

Figure 2B:
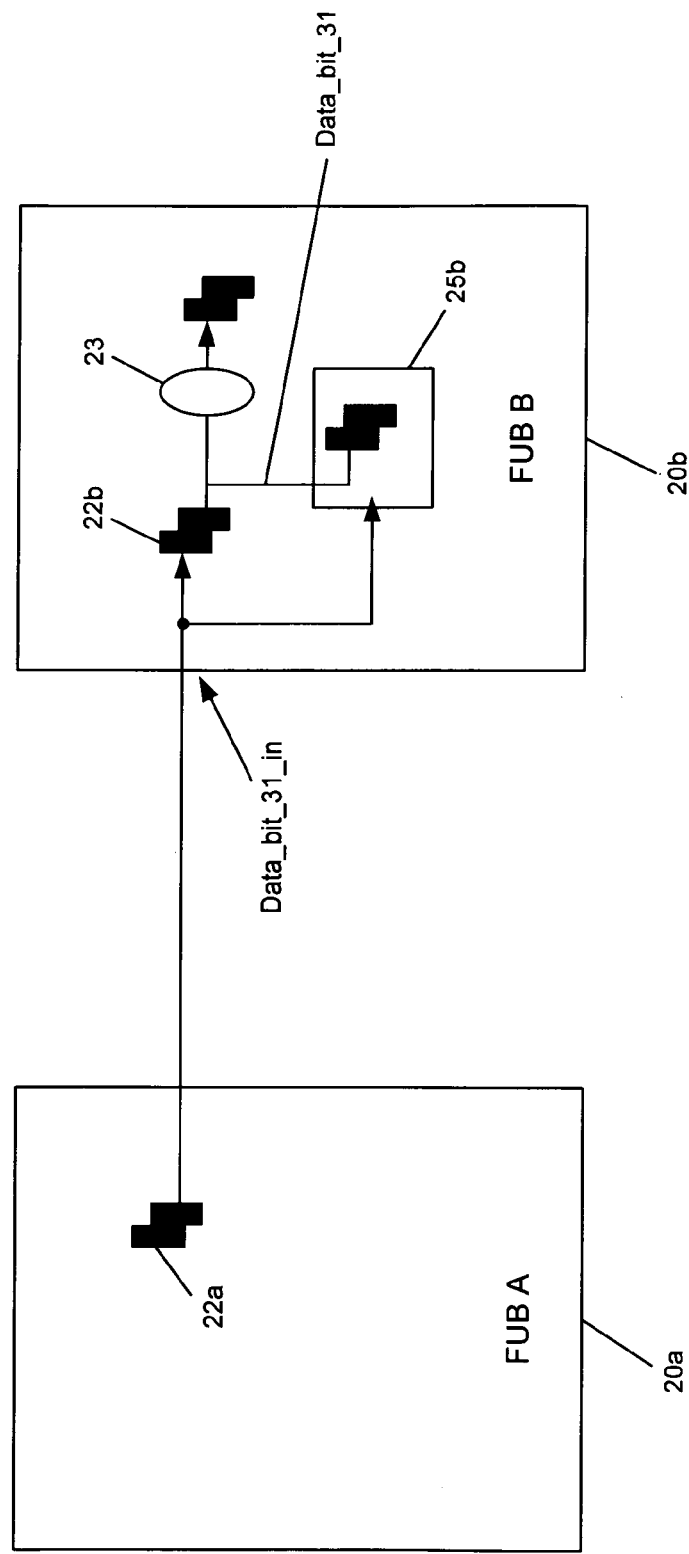
FIG. 2B is an example placement of a functional multiple input shift register (F-MISR) in a functional unit block (FUB) in accordance with one embodiment of the present invention.

As shown in FIG. 2B, shown is an example placement of an F-MISR $25_b$ in a functional unit block (FUB) $20_d$, which receives an input signal, Data_bit_31_in, from an output flop $22_a$ of a first functional unit block $20_a$. As shown in FIG. 2B this input signal is provided to an input flop $22_b$, and in turn to a functional circuit 23. Still further, the output of flop $22_b$ is provided to F-MISR $25_b$ as Data_bit_31. To enable RAS mode testing, the input signal to FUB $20_b$, Data_bit_31_in, may directly be coupled to F-MISR $25_b$, as described further with regard to FIG. 3A. Thus as shown in FIG. 2B, F-MISR 25 acts as a listening flop on global paths between two FUBs and serves as a data compression cell. Still further, F-MISR 25 may act as an exclusive OR (XOR) of the input and output of flop $22_b$ to detect for errors in this flop.

Figure 3A:
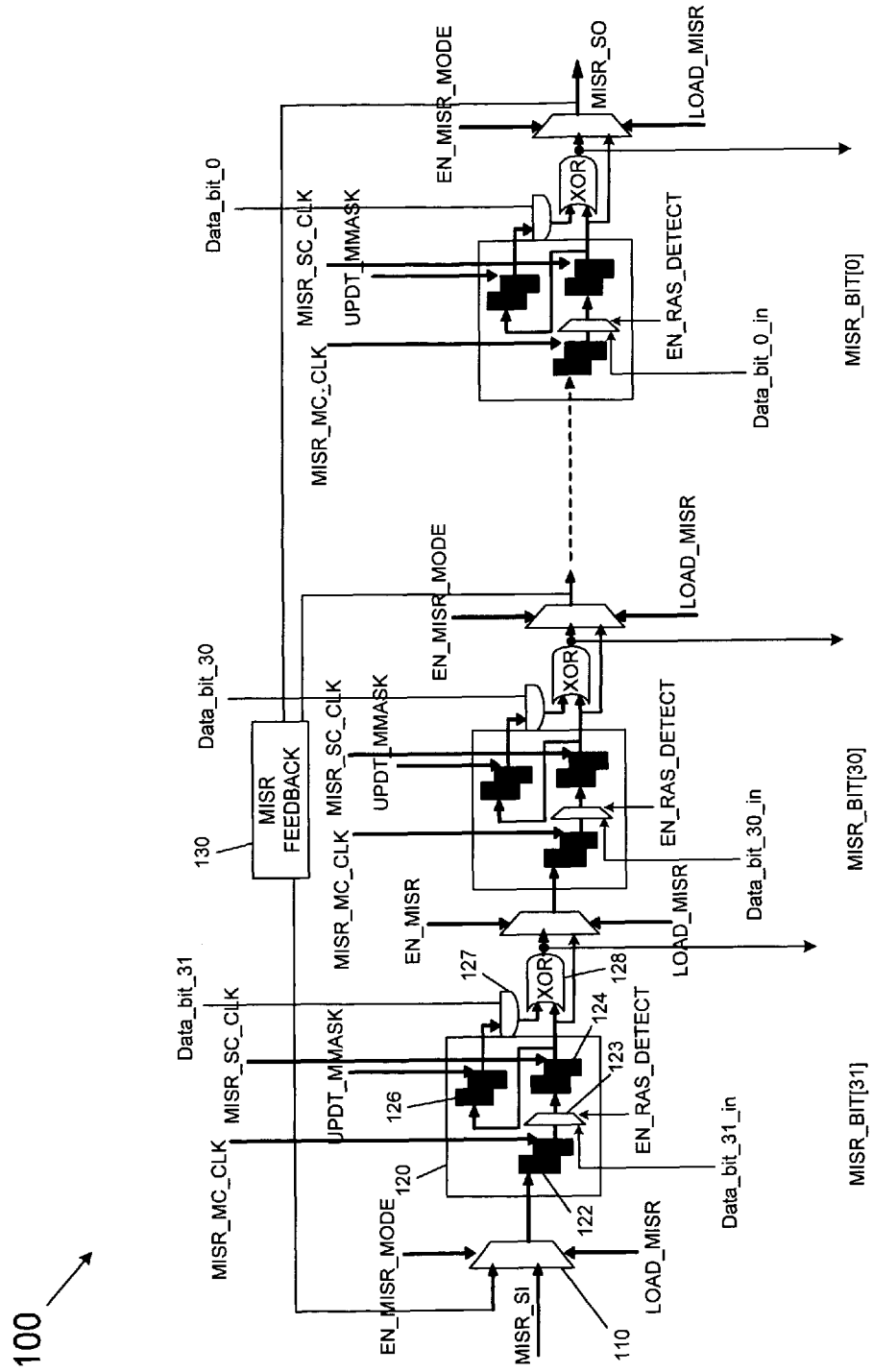
FIG. 3A is a more detailed block diagram of a F-MISR in accordance with one embodiment of the present invention.

Referring now to FIG. 3A, shown is a more detailed block diagram of an F-MISR in accordance with one embodiment of the present invention. As shown in FIG. 3A, F-MISR 100 includes a plurality of bit cells 120 (only one of which is enumerated in FIG. 3A) which are coupled together with various intervening logic and a multiplexer 110. F-MISR 100 further includes a feedback controller 130. Incoming data bits are provided to each bit cell 120, and incoming initialization data, MISR_SI, is provided to first multiplexer 110, and in turn, the output of bit cell 0 is provided out of the last multiplexer 110 as MISR_SO.

In the embodiment shown in FIG. 3A, each bit cell 120 may include a receiving cell 122, a launching cell 124 and a mask cell 126. As shown in FIG. 3A, receiving cell 122 and launching cell 124 may be interconnected by way of a multiplexer 123, which, when enabled by the EN_RAS_DETECT signal, provides the input data bit to launching cell 124, rather than the output of receiving cell 122. In this way, during RAS mode a comparison can be made between Data_bit_31_in signal and the Data_bit_31 signal, the first of which is provided from the input to the flop at the front end of the logical unit, and the second of which is provided from the output of this flop to thus test whether an error occurs through the flop.

Receiving cell 122 may also be referred to herein as an A "flop" and launching cell 124 referred to as a B "flop." These various cells are controlled by clock and control signals, as will be discussed further below. The output of mask cell 126 is provided to a logic gate 127, along with an incoming data bit, the output of which is provided to an exclusive-OR (XOR) gate 128, which is further coupled to receive the output from launching cell 124. As shown, this output from launching cell 124 is further provided to the downstream multiplexer 110, along with output of XOR gate 128. Note further that the output of XOR gate 128 provides an observation point that can be coupled to a error recovery mechanism such as an error correction code (ECC) circuitry, during RAS mode. Thus FIG. 3A shows an F-MISR implementation based on non-scan sequential cells. Note that via cells 122 and 124, a snapshot of processor internal state nodes can be taken over a period of two consecutive clock cycles.

In various embodiments, each of cells 122, 124 and 126 can be either a flip-flop or a latch. In one embodiment, a flop may be used, rather than a latch, to yield a more robust implementation. The area overhead of using a flop over a latch should not be a factor, and the added robustness may justify the slight area increase for using a flop. The data is compressed through XOR gate 128 and into the 'A' flop 122 of the next bit cell. The 'B' flop 124 gets a copy of the compressed data a cycle later when the F-MISR is enabled. Mask flop 126 is controlled by the UPDT_MMASK signal. Mask flop 126 is initialized at the same time that F-MISR 100 is initialized before a test sequence begins. Mask flop 126 is intended to mask off any data that may corrupt the signature of the F-MISR or any data that may be problematic for any reason. Mask flop 126 is initialized when a TAP finite state machine (FSM) is in the UPDATE_DR state and the TAP instruction register (IR) contains the TAP LOAD_MISR instruction. F-MISR 100 may be disabled by the TAP controller before its signature is read through the TAP JTAG test access bus.

By providing separate, non-overlapping, 'A' clock and 'B' clock gating signals to the receiving and launching cells, the F-MISR signature can be shifted out with no possibility of a min-delay issues in the F-MISR scan path.

Figure 3B:
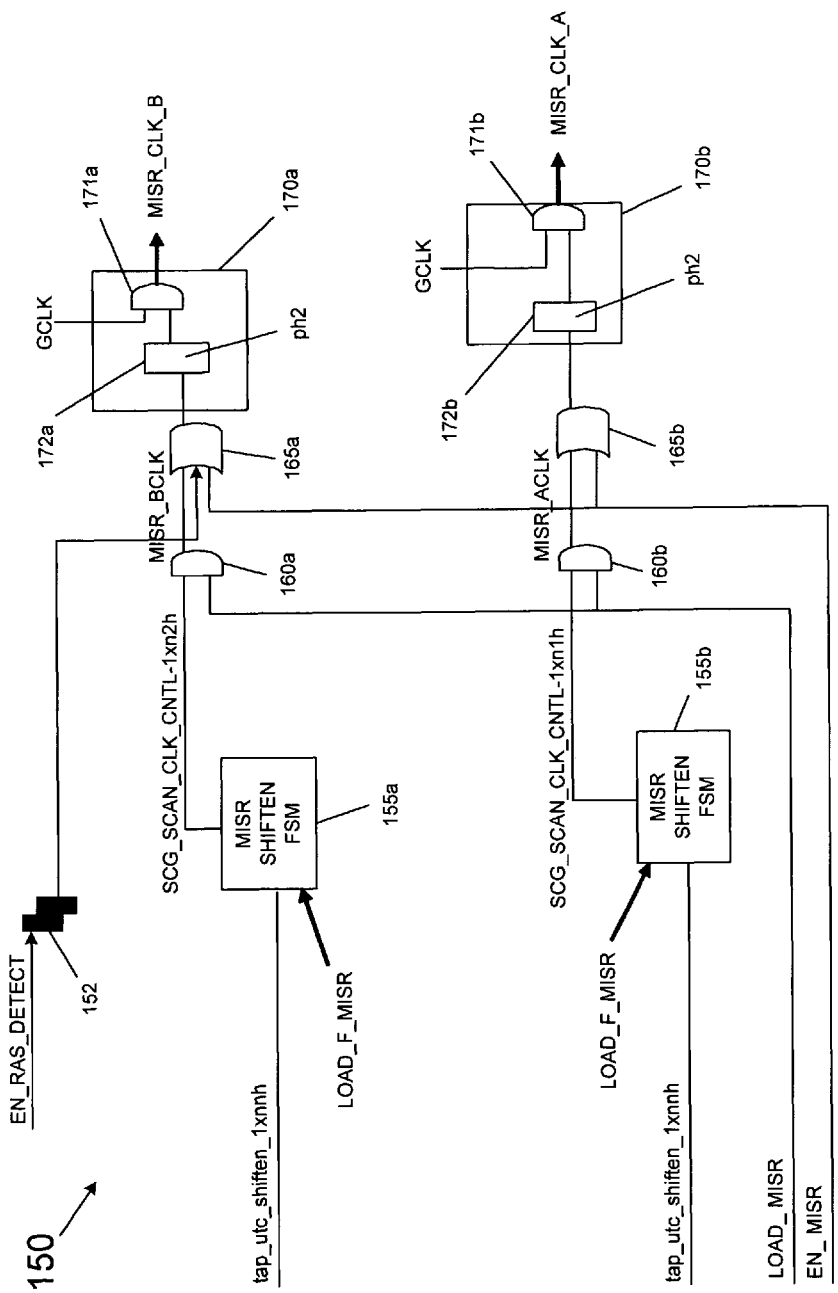
FIG. 3B is a block diagram of F-MISR clock generation and gating in accordance with one embodiment of the present invention.

FIG. 3B shows a block diagram of F-MISR clock generation and gating 150 in accordance with one embodiment of the present invention. Specifically, a MISR FSM $155_a$ receives a TAP shift enable signal and acts as a falling edge detector of a test (TCK) clock when the TAP FSM is in the SHIFT_DR state and the TAP instruction register is in the LOAD_F_MISR state. On this falling edge detection, FSM $155_a$ outputs a scan clock control signal which is provided to a logic gate $160_a$, which is further coupled to receive a LOAD_MISR signal from the TAP controller. The output of logic gate $160_a$ is provided to a logic gate $165_a$, which may be an OR gate, also coupled to receive an enable signal EN_MISR from the TAP controller and a RAS enable signal, EN_RAS_DETECT, through a flop 152. The output of logic gate $165_a$ is provided to a clock generator $170_a$ that includes a phase 1 clock latch 172 and a logic gate 174 to thus generate the B clock gating signal, MISR_CLK_B. Similar logic $155_b$-$170_b$ is also present to generate the A clock gating signal. However, FSM $155_b$ acts as a rising edge detector such that these clock signals are non-overlapping. Note that in various embodiments LOAD_MISR and EN_MISR are mutually exclusive. LOAD_MISR is active after the TAP controller sees an instruction to load the MISR, and EN_MISR can be active in response to a breakpoint event generated by the TAP controller or internal to the core or uncore. In one embodiment, this clock generation logic may reside in a slave scan controller (SSC) with staging flops present in a unit test control (UTC). In one embodiment, a UTC configuration register may be used to enable/trigger the F-MISRs. Note that the SSC and the UTC may be scan controllers that control scan-based testing of a device, and may also be used in connection with the F-MISRs in accordance with an embodiment of the present invention.

Figure 3C:
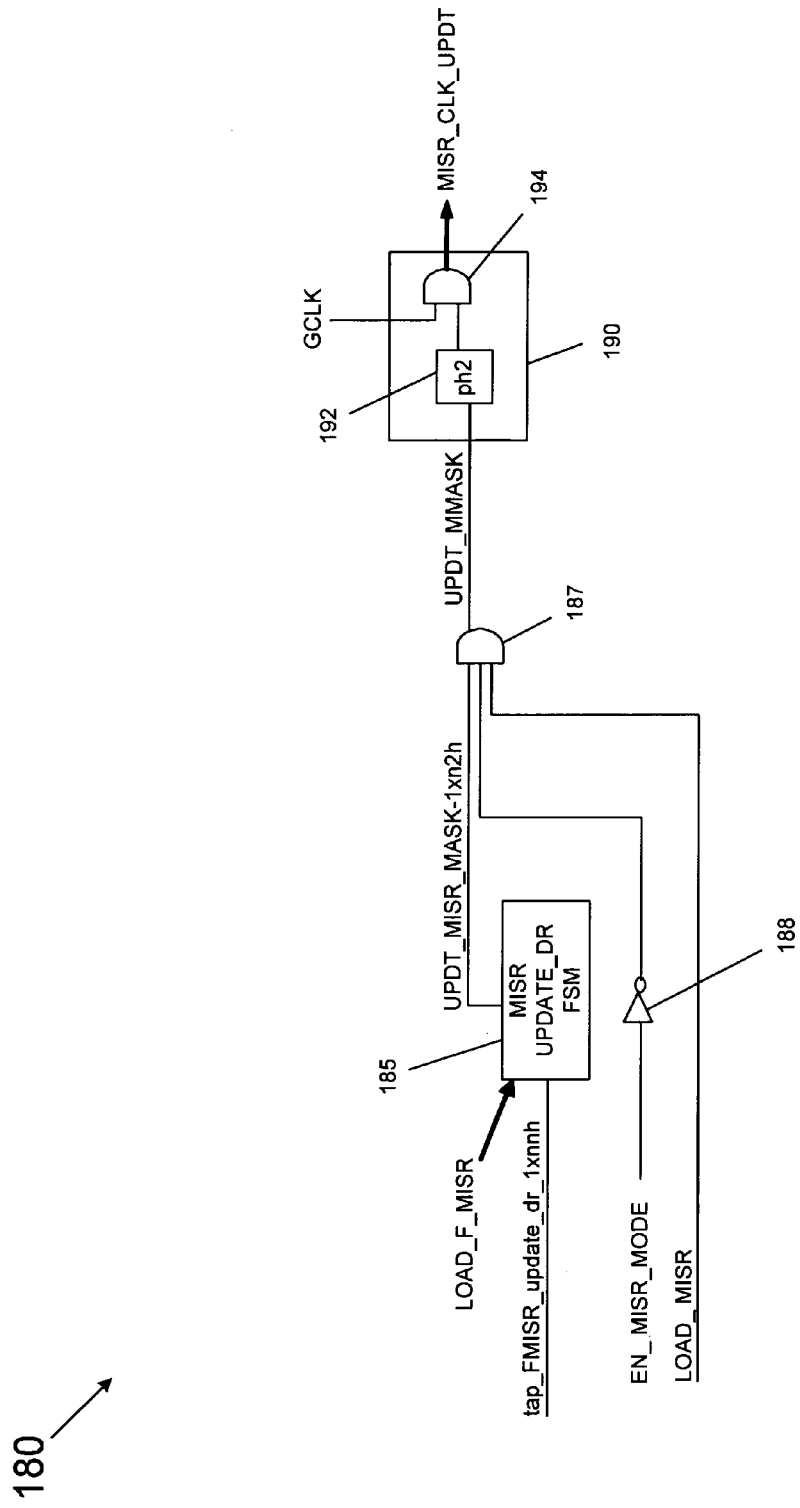
FIG. 3C is a block diagram of clock generation and gating of a mask cell of a F-MISR in accordance with one embodiment of the present invention.

Referring now to FIG. 3C, shown is a block diagram of F-MISR clock generation and gating for a mask cell of a F-MISR. Specifically, in FIG. 3C clock generator 180 includes an update FSM 185 that acts as a rising edge detector of the TCK clock when the TAP FSM is in the UPDT_DR state and the instruction register includes a LOAD_F_MISR instruction. The output of FSM 185 is coupled to a logic gate 187 that is further coupled to receive an inverted version of the MISR enable signal (through inverter 188) and the LOAD_MISR signal, both from the TAP controller. The output of logic gate 187 is provided to clock generator 190 including phase 2 clock latch 192 and logic gate 194 to thus generate the MISR_CLOCK_UPDT signal that is provided to the mask cells of the F-MISR. While shown with these particular implementations, the scope of the present invention is not limited in this regard.

Thus FIGS. 3B and 3C essentially show the F-MISR operating in the following modes: load F-MISR mode, where the TAP controller controls both the MISR ACLK and BCLK for the purpose of initializing or unloading the F-MISR; update F-MISR MASK register, where the TAP controller controls the clock to the mask flop through enabling the local clock to this flop when the TAP FSM is in the UPDATE_DR state and the TAP IR contains the LOAD_F_MISR instruction; F-MISR_Enable Mode, where the F-MISR clocks are basically free running at system clock frequency, (note that data compression may occur in this mode); and F-MISR_Disable mode, in which the F-MISR clocks are gated off by the TAP controller when the F-MISR is idle. Note that because loading and unloading the F-MISR happens at a low scan clock frequency with the scan clocks separated and non-overlapping, min-delay or max-delay issues can be avoided.

Figure 4:
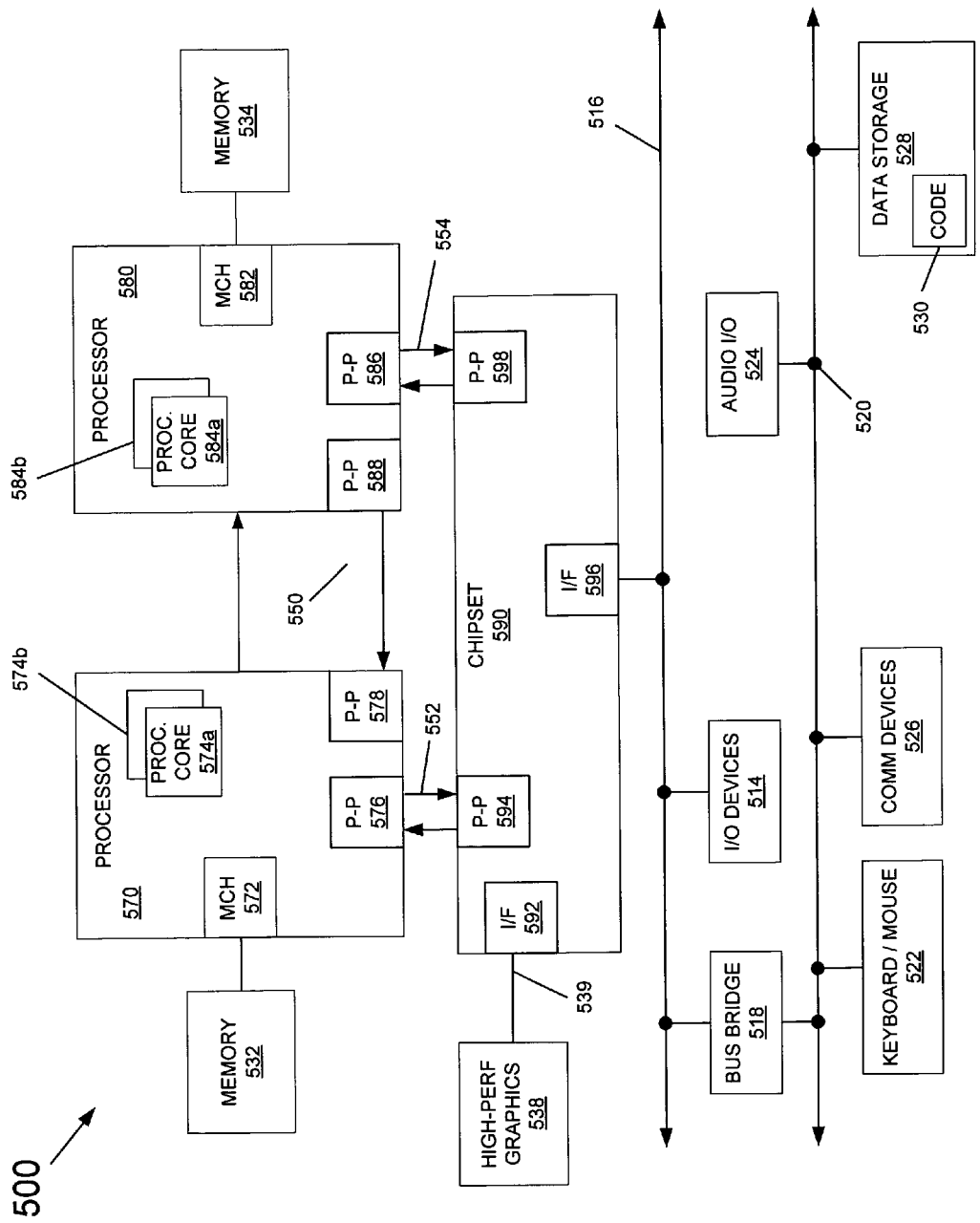
FIG. 4 is a block diagram of a system in accordance with an embodiment of the present invention.

Embodiments may be implemented in many different system types. Referring now to FIG. 4, shown is a block diagram of a system in accordance with an embodiment of the present invention. As shown in FIG. 4, multiprocessor system 500 is a point-to-point interconnect system, and includes a first processor 570 and a second processor 580 coupled via a point-to-point interconnect 550. As shown in FIG. 4, each of processors 570 and 580 may be multicore processors, including first and second processor cores (i.e., processor cores 574a and 574b and processor cores 584a and 584b). Each processor core may include generic common testing hardware to handle various test operations as described above, as well as software, firmware or combinations thereof to execute on such hardware.

Still referring to FIG. 4, first processor 570 further includes a memory controller hub (MCH) 572 and point-to-point (P-P) interfaces 576 and 578. Similarly, second processor 580 includes a MCH 582 and P-P interfaces 586 and 588. As shown in FIG. 4, MCH's 572 and 582 couple the processors to respective memories, namely a memory 532 and a memory 534, which may be portions of main memory (e.g., a dynamic random access memory (DRAM)) locally attached to the respective processors. First processor 570 and second processor 580 may be coupled to a chipset 590 via P-P interconnects 552 and 554, respectively. As shown in FIG. 4, chipset 590 includes P-P interfaces 594 and 598.

Furthermore, chipset 590 includes an interface 592 to couple chipset 590 with a high performance graphics engine 538 via a P-P interconnect 539. In turn, chipset 590 may be coupled to a first bus 516 via an interface 596. As shown in FIG. 4, various I/O devices 514 may be coupled to first bus 516, along with a bus bridge 518 which couples first bus 516 to a second bus 520. Various devices may be coupled to second bus 520 including, for example, a keyboard/mouse 522, communication devices 526 and a data storage unit 528 such as a disk drive or other mass storage device which may include code 530, in one embodiment. Further, an audio I/O 524 may be coupled to second bus 520.

Embodiments may be implemented in code and may be stored on a storage medium having stored thereon instructions which can be used to program a system to perform the instructions. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a processor having a plurality of logical units to perform operations on data, wherein each of the logical units includes a multiple input shift register (MISR) at an input of the logical unit to collect and compress data from a plurality of input signals to the logical unit, wherein the MISR is a common test structure to perform design for test (DFT) operations, reliability-availability-serviceability (RAS) operations, structured based functional test (SBFT) operations and debug operations, wherein the plurality of MISRs are configured as a scan chain having a first MISR coupled to an output of a test access port (TAP) controller and a last MISR coupled to an input of the TAP controller.

2. The apparatus of claim 1, wherein the MISR is to receive a corresponding one of the plurality of input signals from each of a plurality of flops coupled at an input of the logical unit, the plurality of flops to further provide the plurality of input signals to functional units of the logical unit.

3. The apparatus of claim 1, wherein the MISR is to receive an enable signal and a load signal from the TAP controller.

4. The apparatus of claim 3, wherein the MISR includes a plurality of bit cells, each bit cell having a first cell to receive incoming data and controlled by a first clock signal, a second cell to receive an output of the first cell and controlled by a second clock signal, and a mask cell to receive an output of the second cell and to generate a mask signal responsive to a mask clock signal.

5. The apparatus of claim 4, wherein the first cell, the second cell, and the mask cell each comprise a flop.

6. The apparatus of claim 4, further comprising a first logic gate to receive the output of the second cell and an output of a second logic gate, the second logic gate to receive the output of the mask cell and an incoming data bit of one of the plurality of input signals, the first logic gate to compress the incoming data bit.

7. The apparatus of claim 6, further comprising a multiplexer coupled between the first cell and the second cell, the multiplexer to provide the output of the first cell in a DFT mode and to provide the incoming data bit in a RAS mode, wherein the incoming data bit provided to the second logic gate is delayed from the incoming data bit provided to the second cell.

8. The apparatus of claim 6, wherein an output of the first logic gate is to be provided to an error recovery mechanism in the RAS mode, the output of the first logic gate indicative of an error in a flop that provides the incoming data bit to the second logic gate.

9. The apparatus of claim 4, further comprising a first clock generator to generate the first clock signal, the first clock generator including a first finite state machine (FSM) to detect a falling edge of a test clock, and first logic to receive a control signal from the first FSM and the load signal and the enable signal from the TAP controller and to generate the first clock signal therefrom.

10. The apparatus of claim 9, further comprising a second clock generator to generate the second clock signal, the second clock generator including a second finite state machine (FSM) to detect a rising edge of the test clock, wherein the first clock signal and the second clock signal are non-overlapping.

11. A system comprising:
a processor having a plurality of logical units to perform operations on data, where each of the logical units includes a multiple input shift register (MISR) at an input of the logical unit to collect and compress data from a plurality of input signals to the logical unit, each MISR including a plurality of bit cells, each bit cell having a first cell to receive incoming data and controlled by a first clock signal, a second cell to receive an output of the first cell and controlled by a second clock signal, a mask cell to receive an output of the second cell and to generate a mask signal responsive to a mask clock signal, and a multiplexer coupled between the first cell and the second cell to provide the output of the first cell in a first mode and to provide a data bit from a different logical unit in a second mode; and
a dynamic random access memory (DRAM) coupled to the processor.

12. The system of claim 11, wherein the MISR is a common test structure to perform design for test (DFT) operations in the first mode, reliability-availability-serviceability (RAS) operations in the second mode, structured based functional test (SBFT) operations and debug operations.

13. The system of claim 11, further comprising a first logic gate to receive the output of the second cell and an output of a second logic gate, the second logic gate to receive the output of the mask cell and the data bit, the first logic gate to compress the data bit, wherein the data bit provided to the second logic gate is delayed from the data bit provided to the second cell.

14. The system of claim 11, further comprising a first clock generator to generate the first clock signal, the first clock generator including a first finite state machine (FSM) to detect a falling edge of a test clock, and first logic to receive a control signal from the first FSM and control signals from a test access port (TAP) controller, and a second clock generator to generate the second clock signal, the second clock generator including a second FSM to detect a rising edge of the test clock, wherein the first clock signal and the second clock signal are non-overlapping.

15. The system of claim 11, wherein a snapshot of a state of an internal node of the processor may be taken over a first clock cycle and a second clock cycle via the first cell and the second cell.

* * * * *